United States Patent
Inoue et al.

(10) Patent No.: US 11,909,379 B2
(45) Date of Patent: Feb. 20, 2024

(54) MEMS DEVICE HAVING A CONNECTION PORTION FORMED OF A EUTECTIC ALLOY

(71) Applicant: Murata Manufacturing Co., Ltd., Nagaokakyo (JP)

(72) Inventors: Yoshihisa Inoue, Nagaokakyo (JP); Masakazu Fukumitsu, Nagaokakyo (JP); Yuichi Goto, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 658 days.

(21) Appl. No.: 17/108,007

(22) Filed: Dec. 1, 2020

(65) Prior Publication Data
US 2021/0083647 A1    Mar. 18, 2021

Related U.S. Application Data

(63) Continuation of application No. PCT/JP2019/029818, filed on Jul. 30, 2019.

(30) Foreign Application Priority Data

Aug. 2, 2018 (JP) ................. 2018-146029

(51) Int. Cl.
*H03H 9/10* (2006.01)
*B81B 7/00* (2006.01)
(Continued)

(52) U.S. Cl.
CPC ......... *H03H 9/1057* (2013.01); *B81B 7/0038* (2013.01); *H03H 9/02259* (2013.01);
(Continued)

(58) Field of Classification Search
CPC ............ H03H 9/1057; H03H 9/02259; H03H 9/2457; H03H 9/0595; H03H 9/2489;
(Continued)

(56) References Cited

U.S. PATENT DOCUMENTS

2012/0032561 A1* 2/2012 Mizusawa ............ H03H 9/0595
  310/344
2013/0328449 A1* 12/2013 Takahashi ............... H10N 30/88
  310/344
(Continued)

FOREIGN PATENT DOCUMENTS

JP    2016201624 A    12/2016
WO    2016158056 A1   10/2016
(Continued)

OTHER PUBLICATIONS

Japanese Office Action issued for Japanese Application No. 2020-534666, date of dispatch Sep. 27, 2021.
(Continued)

*Primary Examiner* — Bernard Rojas
(74) *Attorney, Agent, or Firm* — ArentFox Schiff LLP

(57) ABSTRACT

A MEMS device that includes a substrate including an element and a connection wiring electrically connected to the element, and a connection portion electrically connected to the connection wiring. The connection portion is formed of a eutectic alloy of a first metal and a second metal. A line width of the connection wiring is smaller than a width of the connection portion when a main surface of the substrate is viewed in a plan view.

19 Claims, 15 Drawing Sheets

(51) Int. Cl.
   *H03H 9/02*    (2006.01)
   *H03H 9/24*    (2006.01)
(52) U.S. Cl.
   CPC ... *H03H 9/2457* (2013.01); *B81B 2201/0271* (2013.01); *B81B 2207/07* (2013.01)
(58) Field of Classification Search
   CPC .......... B81B 7/0038; B81B 2201/0271; B81B 2207/07; B81B 7/0006
   See application file for complete search history.

(56) References Cited

U.S. PATENT DOCUMENTS

2018/0048285 A1    2/2018  Nishimura et al.
2018/0127268 A1*   5/2018  Fukumitsu ........... H03H 9/1057

FOREIGN PATENT DOCUMENTS

WO    2017047663 A1    3/2017
WO    2017208866 A1    12/2017

OTHER PUBLICATIONS

International Search Report Issued for PCT/JP2019/029818, dated Sep. 10, 2019.
Written Opinion of the International Searching Authority issued for PCT/JP2019/029818, dated Sep. 10, 2019.

* cited by examiner

MEMS DEVICE HAVING A CONNECTION PORTION FORMED OF A EUTECTIC ALLOY

CROSS REFERENCE TO RELATED APPLICATIONS

The present application is a continuation of International application No. PCT/JP2019/029818, filed Jul. 30, 2019, which claims priority to Japanese Patent Application No. 2018-146029, filed Aug. 2, 2018, the entire contents of each of which are incorporated herein by reference.

FIELD OF THE INVENTION

The present invention relates to a MEMS device.

BACKGROUND OF THE INVENTION

Devices manufactured using Micro Electro Mechanical Systems (MEMS) technology have widely been used. The devices are formed by bonding an upper substrate to a lower substrate including a resonator (piezoelectric body), for example.

For example, Patent Document 1 discloses a MEMS device including a lower substrate including an element (resonator), an upper substrate provided to face the element, and a bonding portion configured to bond the lower substrate and the upper substrate to each other at the circumference of the element. The bonding portion includes a region including a hypereutectic alloy and a region including a eutectic alloy. Covering the eutectic alloy with the hypereutectic alloy prevents a metal from protruding out from the bonding plane of the eutectic bonding in the MEMS device.

Patent Document 1: International Publication No. 2017/047663

SUMMARY OF THE INVENTION

In the MEMS device described in Patent Document 1, a method of forming a connection portion formed of a eutectic alloy is employed in order to draw out a connection wiring to the upper substrate including an outer terminal from an electrode of the element in the lower substrate.

However, when the metal disposed on the upper substrate and the metal disposed on the lower substrate are bonded with eutectic bonding, the metal of the upper substrate may diffuse along the connection wiring extending from the connection portion. As a result, the metal of the upper substrate diffused from the connection portion may affect the element of the lower substrate, or a decrease in the metal amount of the upper substrate in the connection portion may cause a eutectic reaction to fail and an electrical connection of the connection portion to become unstable.

The present invention has been made in view of the above circumstances, and an object of the present invention is to provide a MEMS device capable of reducing the diffusion along the connection wiring of a metal which is part of the eutectic alloy forming the connection portion.

A resonance device according to an aspect of the present invention includes a substrate including an element and a connection wiring electrically connected to the element, and a connection portion electrically connected to the connection wiring and formed of a eutectic alloy of a first metal and a second metal. The width of the connection wiring is smaller than the width of the connection portion when the main surface of the substrate is viewed in a plan view of the substrate.

According to the present invention, it is possible to reduce diffusion along the connection wiring of a metal which is part of a eutectic alloy forming the connection portion.

DETAILED DESCRIPTION OF THE PREFERRED EMBODIMENTS

Figure 1:
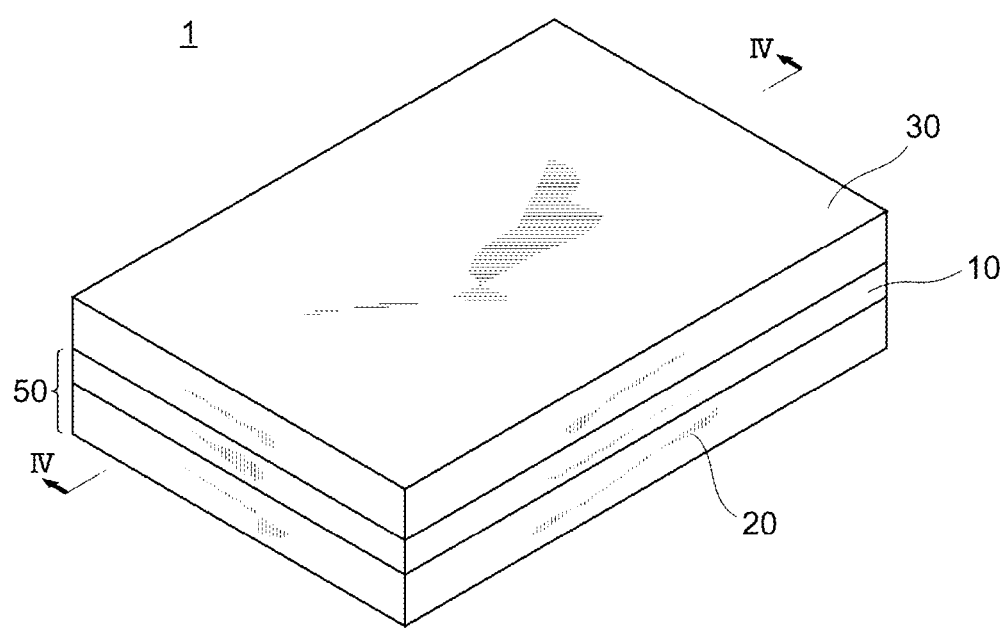
FIG. 1 is a perspective view schematically illustrating an external appearance of a resonance device according to an embodiment of the present invention.

Hereinafter, embodiments of the present invention will be described. The same or similar components are denoted by the same or similar reference numerals in the following description of the drawings. The drawings are illustrative, the dimensions and shapes of the respective portions are schematic, and the technical scope of the present invention should not be construed as limited to the embodiments.

EMBODIMENT

Figure 2:
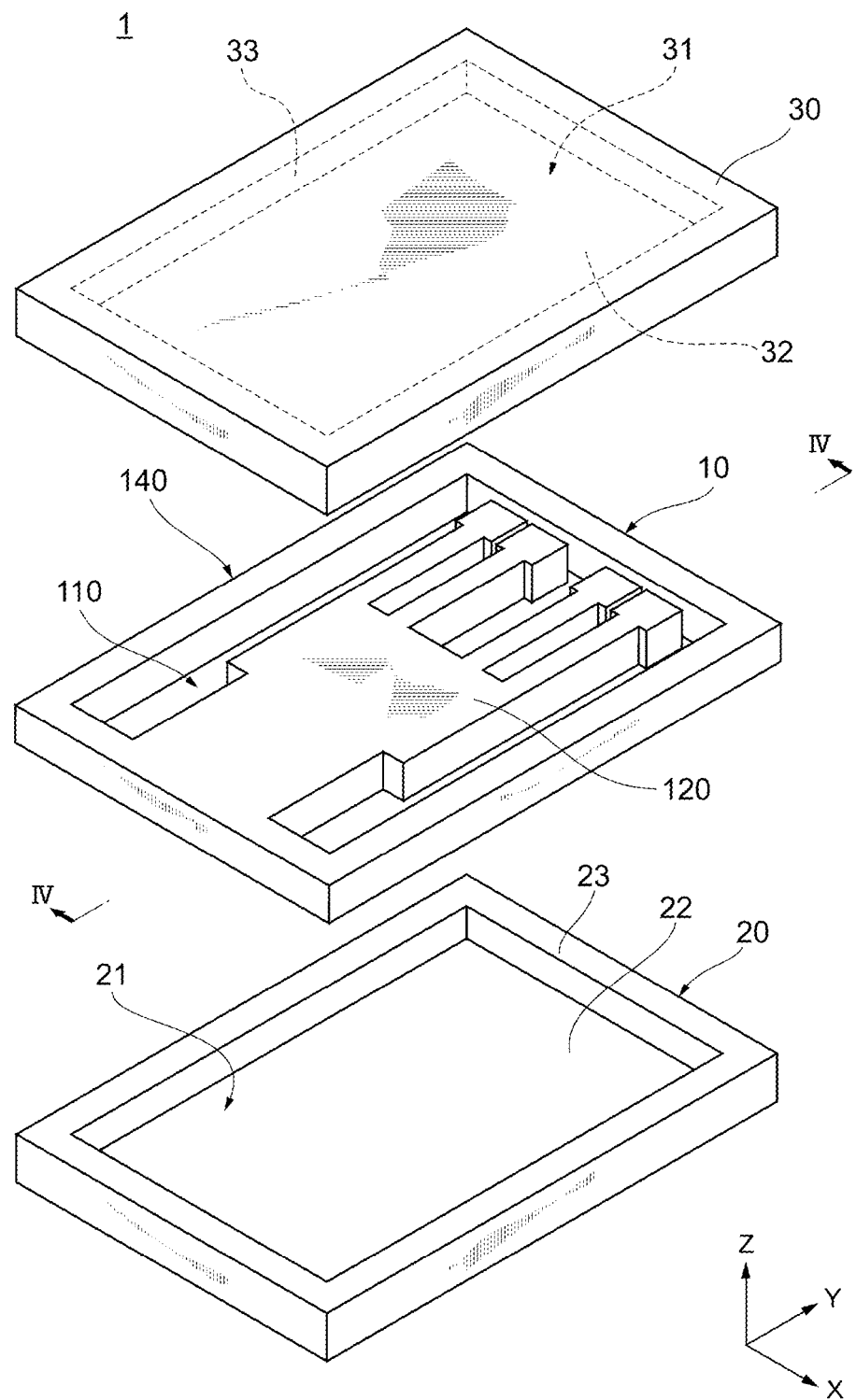
FIG. 2 is an exploded perspective view schematically illustrating a structure of the resonance device illustrated in FIG. 1.

A schematic configuration of a resonance device 1 according to an embodiment of the present invention will be described with reference to FIG. 1 and FIG. 2. FIG. 1 is a perspective view schematically illustrating an external appearance of the resonance device 1 according to an embodiment of the present invention. FIG. 2 is an exploded perspective view schematically illustrating a structure of the resonance device 1 illustrated in FIG. 1.

The resonance device 1 includes a lower lid 20, a resonator 10 (hereinafter, the lower lid 20 and the resonator 10 are also collectively referred to as a "MEMS substrate 50"), and an upper lid 30. That is, the resonance device 1 is configured by laminating the MEMS substrate 50, a bonding portion 60, and the upper lid 30 in this order. The resonance device 1 corresponds to an example of a "resonance device" of the present invention, the resonator 10 corresponds to an example of an "element" of the present invention, and the MEMS substrate 50 corresponds to an example of a "substrate" of the present invention.

Hereinafter, each configuration of the resonance device 1 will be described. A side with the upper lid 30 of the resonance device 1 will be described as an upper side (or a front side), and a side with the lower lid 20 of the resonance device 1 will be described as a lower side (or a back side) in the following description.

The resonator 10 is a MEMS vibrator manufactured using MEMS technology. The resonator 10 and the upper lid 30 are bonded to each other via the bonding portion 60, which will be described later. Further, the resonator 10 and the lower lid 20 are each formed using a silicon (Si) substrate (hereinafter referred to as an "Si substrate"), and the Si substrates are bonded to each other. The MEMS substrate 50 (resonator 10 and lower lid 20) may be formed using an SOI substrate.

The upper lid 30 spreads in a plate-like shape along an XY plane, and a flat parallelepiped recess 31, for example, is formed on a rear surface of the upper lid 30. The recess 31 is surrounded by a side wall 33, and forms part of a vibration space in which the resonator 10 vibrates. Further, a getter layer 34 is formed on the resonator 10 side surface of the recess 31 of the upper lid 30. Note that the upper lid 30 may have a plate-like shape without having the recess 31.

The lower lid 20 includes a bottom plate 22 being provided along the XY plane and having a rectangular plate-like shape, and a side wall 23 extending from a peripheral edge portion of the bottom plate 22 in a Z axis direction, that is, in a laminating direction of the lower lid 20 and the resonator 10. A recess 21 is formed by a surface of the bottom plate 22 and an inner surface of the side wall 23, on the surface of the lower lid 20 facing the resonator 10. The recess 21 forms a part of the vibration space of the resonator 10. Note that the lower lid 20 may have a plate-like shape without having the recess 21. Further, a getter layer may be formed on the resonator 10 side surface of the recess 21 on the lower lid 20.

Figure 3:
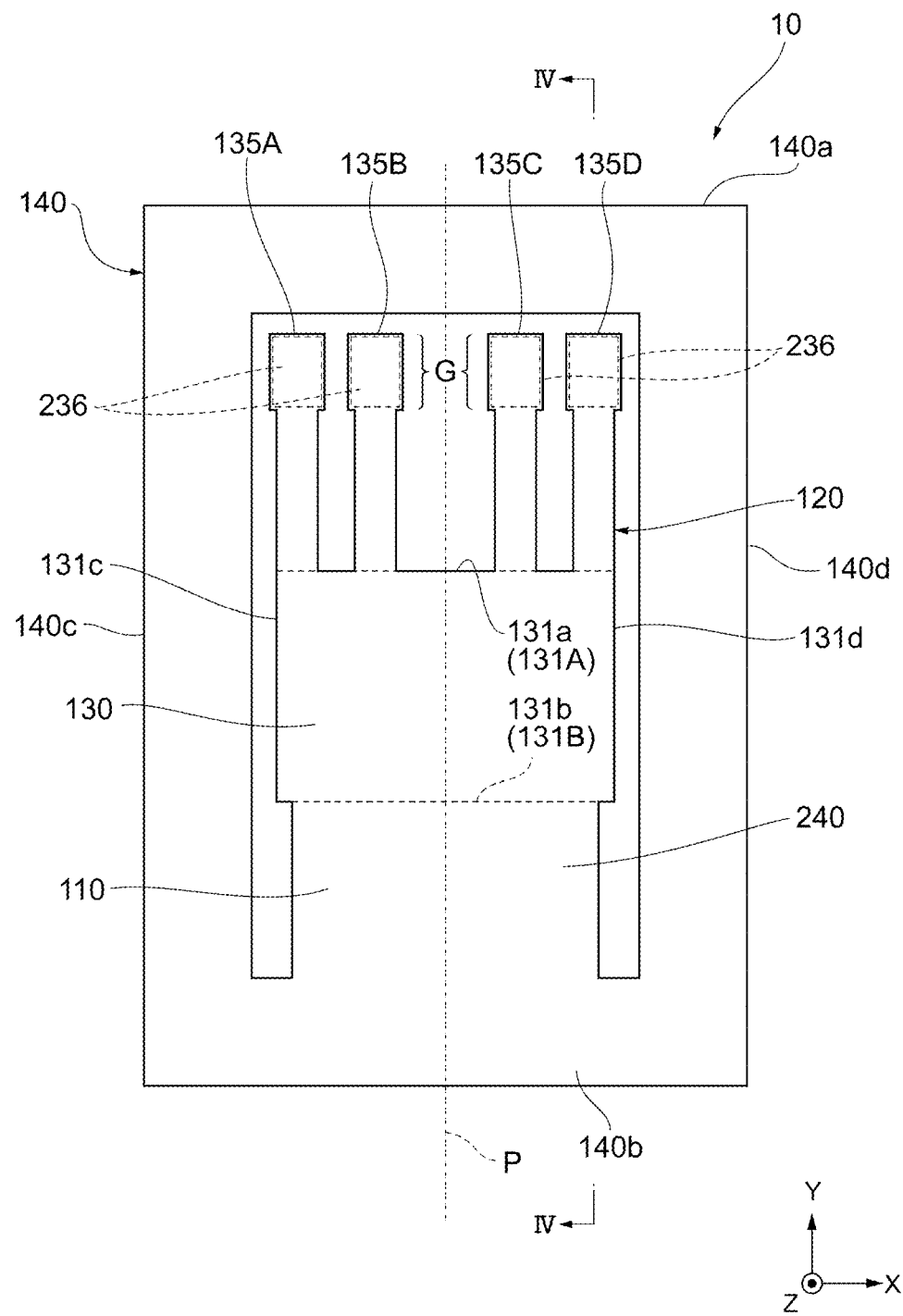
FIG. 3 is a plan view schematically illustrating a structure of a resonator illustrated in FIG. 2.

Next, a schematic configuration of the resonator 10 according to an embodiment of the present invention will be described with reference to FIG. 3. FIG. 3 is a plan view schematically illustrating the structure of the resonator 10 illustrated in FIG. 2.

The resonator 10 is a MEMS vibrator manufactured using MEMS technology as illustrated in FIG. 3, and performs out-of-plane vibration in the XY plane in an orthogonal coordinate system in FIG. 3. Note that the resonator 10 is not limited to a resonator using an out-of-plane bending vibration mode. The resonator of the resonance device 1 may employ a spreading vibration mode, a thickness longitudinal vibration mode, a lamb wave vibration mode, an in-plane bending vibration mode, and a surface acoustic wave vibration mode, for example. These vibrators are applied to timing devices, RF filters, duplexers, ultrasonic transducers, gyro sensors, acceleration sensors, and the like, for example. Further, the vibrators may be used in piezoelectric mirrors having an actuator function, piezoelectric gyros, piezoelectric microphones having a pressure sensor function, ultrasonic vibration sensors, and the like. More Further, the vibrators may be applied to electrostatic MEMS elements, electromagnetic driving MEMS elements, and piezoresistive MEMS elements.

The resonator 10 includes a vibration portion 120, a holding portion 140, and a holding arm 110.

The holding portion 140 is formed in a rectangular frame shape so as to surround the outer side portion of the vibration portion 120 along the XY plane. For example, the holding portion 140 is integrally formed from a prismatic shaped frame body. Note that the holding portion 140 preferably be provided to at least part of the periphery of the vibration portion 120, and is not limited to a frame shape.

The holding arm 110 is provided inside the holding portion 140, and connects the vibration portion 120 and the holding portion 140 to each other.

The vibration portion 120 is provided inside the holding portion 140, and the vibration portion 120 and the holding portion 140 form a space with a predetermined gap. The vibration portion 120 has a base section 130 and four vibration arms 135A to 135D (hereinafter collectively referred to as "vibration arms 135") in an example illustrated in FIG. 3. Note that the number of vibration arms is not limited to four, and is set to be any number of one or more, for example. The vibration arms 135A to 135D and the base section 130 are integrally formed in the present embodiment.

The base section 130 has long sides 131a and 131b in an X axis direction, and short sides 131c and 131d in a Y axis direction in a plan view. The long side 131a is one side of a front end plane of the base section 130 (hereinafter also referred to as "front end 131A"), and the long side 131b is one side of the rear end plane of the base section 130 (hereinafter referred to as "rear end 131B"). The front end 131A and the rear end 131B are provided so as to face each other in the base section 130.

The base section 130 is connected to the vibration arms 135 at the front end 131A, and is connected to the holding arm 110, which will be described later, at the rear end 131B. Note that the shape of the base section 130 is substantially rectangular in a plan view in the example illustrated in FIG. 3, but is not limited thereto. The base section 130 needs to be formed substantially plane-symmetric with respect to a virtual plane P defined along a perpendicular bisector of the long side 131a. For example, the base section 130 may have a trapezoidal shape whose long side 131b is shorter than 131a, or may have a semi-circular shape whose diameter is the long side 131a. Further, each surface of the base section 130 is not limited to a flat surface, and may be a curved surface. The virtual plane P is a plane that passes through a center of the vibration portion 120 in a direction in which the vibration arms 135 are aligned.

The base section 130 has a base section length of about 35 μm which is the longest distance between the front end 131A and the rear end 131B in a direction from the front end 131A toward the rear end 131B. In addition, the base section width which is the longest distance between side ends of the base section 130 is about 265 μm. The base section width is in a width direction orthogonal to the base section length direction.

The vibration arms 135 extend in the Y axis direction and have the same size as each other. Each of the vibration arms 135 is provided between the base section 130 and the holding portion 140 in parallel to the Y axis direction, and one end thereof is connected to the front end 131A of the base section 130 to be a fixed end, while the other end thereof is an open end. Further, the vibration arms 135 are provided in parallel with each other at a predetermined interval in the X axis direction. The vibration arm 135 has a width of about 50 µm in the X axis direction and a length of about 465 µm in the Y axis direction, for example.

A portion about 150 µm from the open end, for example, of each vibration arm 135 is wider than other portions of the vibration arm 135 in the X axis direction width. A portion having a wider width is referred to as a weight portion G. The weight portion G has a wider width by 10 µm in the right and left along the X axis direction relative to other portions of the vibration arm 135, and has a width of about 70 µm in the X axis direction, for example. The weight portion G is integrally formed with the vibration arm 135 by the same process. By forming the weight portion G, the weight per unit length is heavier at the open end side than at the fixed end side in the vibration arm 135. Accordingly, since each of the vibration arms 135 has the weight portion G at the open end side, it is possible to increase the amplitude of vibration in the up-down direction in each vibration arm.

A protection film 235, which will be described later, is formed on the surface (surface facing the upper lid 30) of the vibration portion 120 so as to cover the entire surface thereof. Further, a frequency adjustment film 236 is formed on the surface of the protection film 235 at the open end side tip of the vibration arms 135A to 135D, respectively. The resonant frequency of the vibration portion 120 may be adjusted by the protection film 235 and the frequency adjustment film 236.

A substantially entire surface of the resonator 10 (surface of the side facing the upper lid 30) is covered with the protection film 235 in the present embodiment. Further, a substantially entire surface of the protection film 235 is covered with a parasitic capacitance reduction film 240. Note that it is sufficient that the protection film 235 covers at least the vibration arms 135, and it is not limited to a configuration in which the protection film 235 covers substantially the entire surface of the resonator 10.

Figure 4:
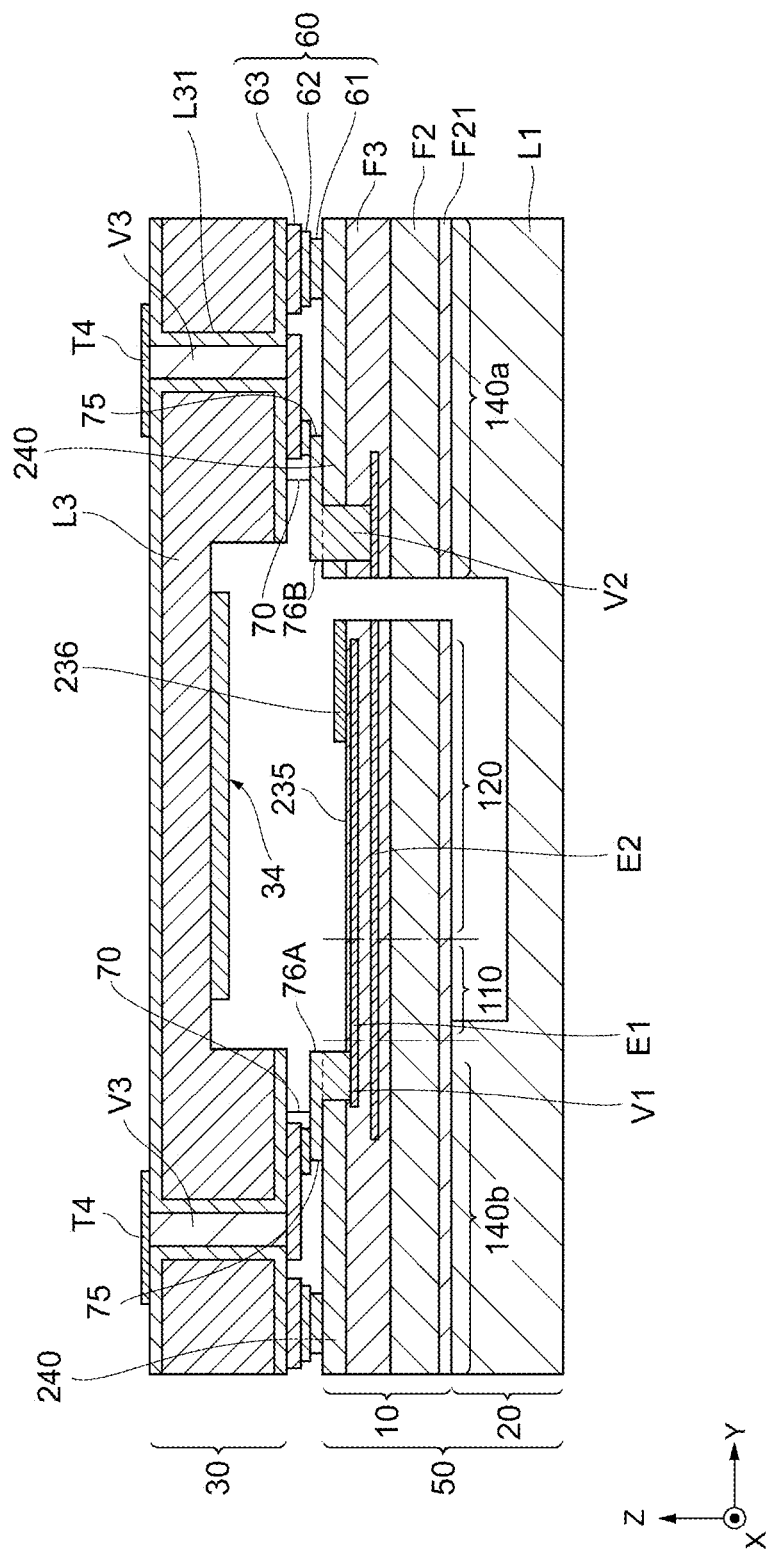
FIG. 4 is a cross-sectional view schematically illustrating a configuration of a cross-section taken along a line IV-IV of the resonance device illustrated in FIG. 1 to FIG. 3.

Next, a laminating structure of the resonance device 1 according to an embodiment of the present invention will be described with reference to FIG. 4. FIG. 4 is a cross-sectional view schematically illustrating a configuration of a cross section taken along a line IV-IV of the resonance device 1 illustrated in FIG. 1 to FIG. 3.

As illustrated in FIG. 4, the holding portion 140 of the resonator 10 is bonded on the side wall 23 of the lower lid 20, and the holding portion 140 of the resonator 10 and the side wall 33 of the upper lid 30 are bonded to each other in the resonance device 1. The resonator 10 is held between the lower lid 20 and the upper lid 30 as described above, and a vibration space in which the vibration arms 135 vibrate is formed by the lower lid 20, the upper lid 30, and the holding portion 140 of the resonator 10. Further, a terminal T4 is formed on the upper surface of the upper lid 30 (the opposite side surface of the surface facing the resonator 10). The terminal T4 and the resonator 10 are electrically connected to each other by a through-electrode V3, a connection portion 70, and a connection wiring 75.

The upper lid 30 is formed of a silicon (Si) wafer (hereinafter referred to as "Si wafer") L3 having a predetermined thickness. The upper lid 30 is bonded to the holding portion 140 of the resonator 10 by the bonding portion 60, which will be described later, at the peripheral portion (side wall 33) thereof. The surface of the upper lid 30 facing the resonator 10, the rear surface, and side surfaces of the through-electrodes V3 are preferably covered by a silicon oxide film L31. The silicon oxide film L31 is formed on the front surface of the Si wafer L3 by oxidation of the surface of the Si wafer L3 or chemical vapor deposition (CVD), for example.

Further, the getter layer 34 is formed on the surface of the recess 31 of the upper lid 30 facing the resonator 10. The getter layer 34 is formed of titanium (Ti), for example, and adsorbs an outgas generated in the vibration space. Since the getter layer 34 is formed on the substantially entire surface of the recess 31 facing the resonator 10 in the upper lid 30 according to the present embodiment, it is possible to suppress a decrease in the degree of vacuum in the vibration space.

Further, the through-electrode V3 of the upper lid 30 is formed by filling a conductive material to the through-hole formed in the upper lid 30. The conductive material to be filled is impurity-doped polycrystalline silicon (Poly-Si), copper (Cu), gold (Au), impurity-doped single crystal silicon, or the like, for example. The through-electrode V3 serves as a wiring for electrically connecting the terminal T4 and a voltage applying portion 141 to each other.

The bottom plate 22 and the side wall 23 of the lower lid 20 are integrally formed by an Si wafer L1. Further, the lower lid 20 is bonded to the holding portion 140 of the resonator 10 at the upper surface of the side wall 23. The thickness of the lower lid 20 defined in the Z axis direction is 150 µm, for example, and the depth of the recess 21 is 50 µm, for example. The Si wafer L1 is formed of non-degenerate silicon and the resistivity thereof is 16 mΩ·cm or more, for example.

The holding portion 140, the base section 130, the vibration arms 135, and the holding arm 110, all of which constitute the resonator 10, are integrally formed in the same process. The resonator 10 has a piezoelectric thin film F3 formed to cover a silicon (Si) substrate F2 and a metal layer E2 is laminated on the piezoelectric thin film F3. The silicon (Si) substrate is an example of the substrate, and hereinafter is referred to as "Si substrate". Then, the piezoelectric thin film F3 is laminated on the metal layer E2 so as to cover the metal layer E2, and a metal layer E1 is further laminated on the piezoelectric thin film F3. The protection film 235 is laminated on the metal layer E1 so as to cover the metal layer E1, and the parasitic capacitance reduction film 240 is laminated on the protection film 235.

The Si substrate F2 is formed of a degenerated n-type silicon (Si) semiconductor having a thickness of about 6 µm, for example, and may include phosphorus (P), arsenic (As), antimony (Sb), or the like as an n-type dopant. The resistance value of the degenerated silicon (Si) used for the Si substrate F2 is less than 16 mΩ·cm, for example, and is more preferably 1.2 mΩ·cm or less. Further, a silicon oxide (for example, $SiO_2$) layer F21 is formed on the lower surface of the Si substrate F2 as an example of the temperature characteristic correction layer. This makes it possible to improve the temperature characteristics. Note that the silicon oxide layer F21 may be formed on the upper surface of the Si substrate F2, or may be formed on both the upper surface and the lower surface of the Si substrate F2.

The metal layers E1 and E2 have a thickness of about 0.1 µm to 0.2 µm, for example, and are patterned into a desired shape by etching or the like after the film formation. As the metal layers E1 and E2, metals having a crystal structure with a body-centered cubic structure are used. Specifically, the metal layers E1 and E2 are formed by using molybdenum (Mo), tungsten (W), or the like.

The metal layer E1 is formed to serve as an upper electrode on the vibration portion 120, for example. Further, the metal layer E1 is formed to serve as a wiring for connecting the upper electrode to an AC power supply provided outside the resonator 10, on the holding arm 110 and the holding portion 140.

The metal layer E2, on the other hand, is formed to serve as a lower electrode on the vibration portion 120. Further, the metal layer E2 is formed on the holding arm 110 and the holding portion 140 so as to serve as a wiring for connecting the lower electrode to a circuit provided outside the resonator 10.

The piezoelectric thin film F3 is made of a piezoelectric body and converts an applied voltage into vibrations. The piezoelectric thin film F3 is formed of a material having a crystal structure of a wurtzite hexagonal structure, and a nitride or an oxide such as aluminum nitride (AlN), scandium aluminum nitride (ScAlN), zinc oxide (ZnO), gallium nitride (GaN), indium nitride (InN), or the like may be used as a main component, for example. Scandium aluminum nitride is made by substituting part of aluminum in aluminum nitride with scandium, and the two elements such as magnesium (Mg) and niobium (Nb), or magnesium (Mg) and zirconium (Zr) instead of scandium may substitute the part of aluminum. In addition, the piezoelectric thin film F3 has a thickness of 1 µm, for example, but it is also possible to have a thickness of about 0.2 µm to 2 µm.

The piezoelectric thin film F3 expands and contracts in the in-plane direction of the XY plane, that is, in the Y axis direction, in accordance with the electric field applied to the piezoelectric thin film F3 through the metal layers E1 and E2. Because of the expansion and contraction of the piezoelectric thin film F3, the vibration arm 135 displaces its free end toward the inner surfaces of the lower lid 20 and the upper lid 30, and vibrates in the out-of-plane bending vibration mode.

The phases of the electric fields applied to the outer side vibration arms 135A and 135D and the phases of the electric fields applied to the inner side vibration arms 135B and 135C are set to be opposite to each other in the present embodiment. With this, the outer side vibration arms 135A and 135D, and the inner side vibration arms 135B and 135C displace in opposite directions to each other. For example, when the free ends of the outer side vibration arms 135A and 135D displace toward the inner surface of the upper lid 30, the free ends of the inner side vibration arms 135B and 135C displace toward the inner surface of the lower lid 20.

The protection film 235 prevents oxidation of the metal layer E2, which is an upper electrode for piezoelectric vibration. It is preferable that the protection film 235 be formed of a material having a lower mass reduction speed of etching than that of the frequency adjustment film 236. The mass reduction speed is represented by an etching speed, that is, a product of a thickness to be removed per unit time and density. The protection film 235 is formed of a piezoelectric film such as aluminum nitride (AlN), scandium aluminum nitride (ScAlN), zinc oxide (ZnO), gallium nitride (GaN), indium nitride (InN), or the like, or an insulation film such as silicon nitride (SiN), silicon oxide ($SiO_2$), alumina ($Al_2O_3$), or the like, for example. The thickness of the protection film 235 is about 0.2 µm, for example.

The frequency adjustment film 236 is formed on the substantially entire surface of the vibration portion 120 first, and then formed only in a predetermined region by a process such as etching. The frequency adjustment film 236 is formed of a material having a higher mass reduction speed of etching than that of the protection film 235. Specifically, the frequency adjustment film 236 is made of a metal such as molybdenum (Mo), tungsten (W), gold (Au), platinum (Pt), nickel (Ni), titanium (Ti), or the like.

Note that, when the relationship between the mass reduction speeds is as described above, any magnitude relationship between the etching speeds of the protection film 235 and the frequency adjustment film 236 is acceptable.

The parasitic capacitance reduction film 240 is formed of tetraethyl orthosilicate (TEOS). The parasitic capacitance reduction film 240 has a thickness of about 1 µm. The parasitic capacitance reduction film 240 reduces a parasitic capacitance in the routing wiring portion and has a function as an insulation layer when wirings with different potential cross, and a function as a standoff for widening the vibration space.

The bonding portion 60 is formed in a rectangular frame shape along the XY plane between the MEMS substrate 50 (resonator 10 and lower lid 20) and the upper lid 30. The bonding portion 60 bonds the MEMS substrate 50 and the upper lid 30 to each other so as to seal the vibration space of the resonator 10. With this, the vibration space is hermetically sealed, and the vacuum state is maintained.

In the present embodiment, the bonding portion 60 is formed by laminating an aluminum (Al) layer 61, a germanium (Ge) layer 62, and an aluminum (Al) layer 63 in this order. The use of the same kind of metal as the connection portion 70 and the connection wiring 75, which will be described later, for the material of the bonding portion 60 makes it possible to simplify the manufacturing process.

The aluminum (Al) layer 61, the germanium (Ge) layer 62, and the aluminum (Al) layer 63 are each described as independent layers, but in practice, each of the interfaces between the layers is a eutectic bonding in the example illustrated in FIG. 4. The bonding portion 60 may be formed of a gold (Au) film, a tin (Sn) film, or the like, or may be formed of a combination of gold (Au) and silicon (Si), gold (Au) and gold (Au), and copper (Cu) and tin (Sn), or the like. In addition, the bonding portion 60 may be formed by thinly sandwiching titanium (Ti), titanium nitride (TiN), tantalum nitride (TaN), or the like between the laminated layers in order to improve adhesion.

The connection portion 70 is electrically connected to the terminal T4 via the through-electrode V3, and is also electrically connected to the connection wiring 75. The connection portion 70 includes a first metal layer 71 and a second metal layer 72. Each of the first metal layer 71 and the second metal layer 72 is described as an independent layer, but in practice, the interface of the layers is a eutectic bonding in the example illustrated in FIG. 4. That is, the connection portion 70 is formed of a eutectic alloy of the first metal layer 71 and the second metal layer 72.

The connection portion 70 is formed as follows. Firstly, the first metal layer 71 is provided to the upper lid 30 side, and the second metal layer 72 is provided to the MEMS substrate 50 side. Next, the positions of the MEMS substrate 50 and the upper lid 30 are aligned so that the first metal layer 71 and the second metal layer 72 coincide with each other. The MEMS substrate 50 and the upper lid 30 are sandwiched by a heater or the like after the alignment, and are treated with heat for eutectic bonding. The temperature in the heat treatment for eutectic bonding is higher than or equal to the amorpheal point temperature, that is 424° C. or higher, for example, and the heating time is about 10 minutes to 20 minutes. During heating, the upper lid 30 and the MEMS substrate 50 of the resonance device 1 is pressed at a pressure of about 5 MPa to 25 MPa, for example.

The metal in the first metal layer 71 is germanium (Ge), and the metal in the second metal layer 72 is aluminum (Al) in the present embodiment. Here, since the eutectic alloy of germanium (Ge) and aluminum (Al) has a large allowance for foreign matter particles compared with the eutectic alloy of other materials, the eutectic reaction is easily achieved and it is possible to obtain a good eutectic bonding at the connection portion 70.

The connection wiring 75 is electrically connected to the resonator 10. Specifically, the connection wiring 75 is electrically connected to the metal layers E1 and E2 of the resonator 10 via contact electrodes 76A and 76B, which will be described later. The connection wiring 75 is made of a metal such as aluminum (Al), gold (Au), tin (Sn), or the like, for example.

The material of the connection wiring 75 is preferably aluminum (Al) which is the same as that of the second metal layer 72 in the present embodiment. With this, it is possible to form the connection wiring 75 and the second metal layer 72 at the same time, and it is possible to simplify the manufacturing process.

A contact electrode 76A is formed so as to be in contact with the metal layer E1, and electrically connects the connection wiring 75 and the resonator 10. A contact electrode 76B is formed so as to be in contact with the metal layer E2, and electrically connects the connection wiring 75 and the resonator 10. Specifically, when the contact electrode 76A and the metal layer E1 are connected, part of the piezoelectric thin film F3, the protection film 235, and the parasitic capacitance reduction film 240 laminated on the metal layer E1 is removed so that the metal layer E1 is exposed, and a via V1 is formed. The formed via V1 is filled with a material similar to that of the contact electrode 76A, and the metal layer E1 and the contact electrode 76A are connected to each other. Similarly, when the contact electrode 76B and the metal layer E2 are connected, part of the piezoelectric thin film F3 and the parasitic capacitance reduction film 240 laminated on the metal layer E2 is removed so that the metal layer E2 is exposed, and a via V2 is formed. The formed via V2 is filled with a material similar to that of the contact electrode 76B, and the metal layer E2 and the contact electrode 76B are connected to each other. The contact electrodes 76A and 76B are made of a metal such as aluminum (Al), gold (Au), tin (Sn), or the like, for example. Note that the connection point between the metal layer E1 and the contact electrode 76A and the connection point between the metal layer E2 and the contact electrode 76B are preferably in regions outside the vibration portion 120, and are connected in the holding portion 140 in the present embodiment.

Figure 5:
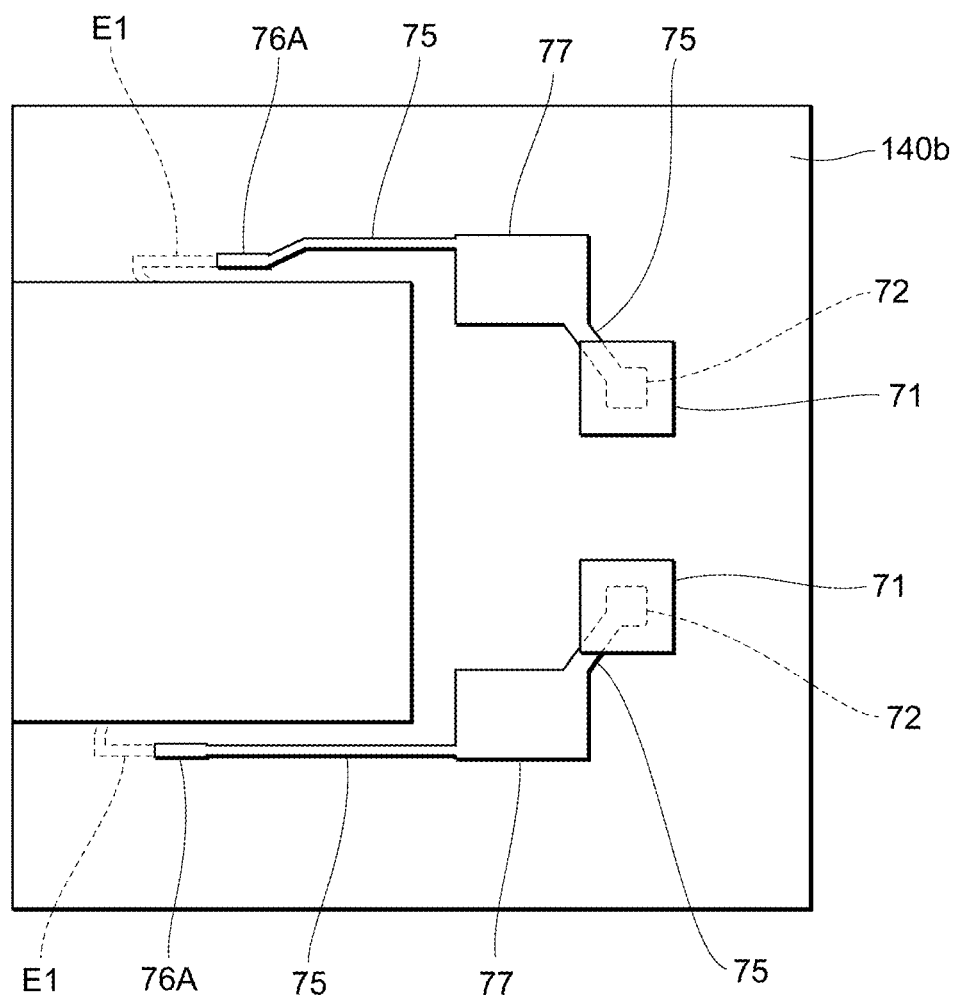
FIG. 5 is a plan view schematically illustrating a periphery of a holding portion illustrated in FIG. 3.
Figure 6:
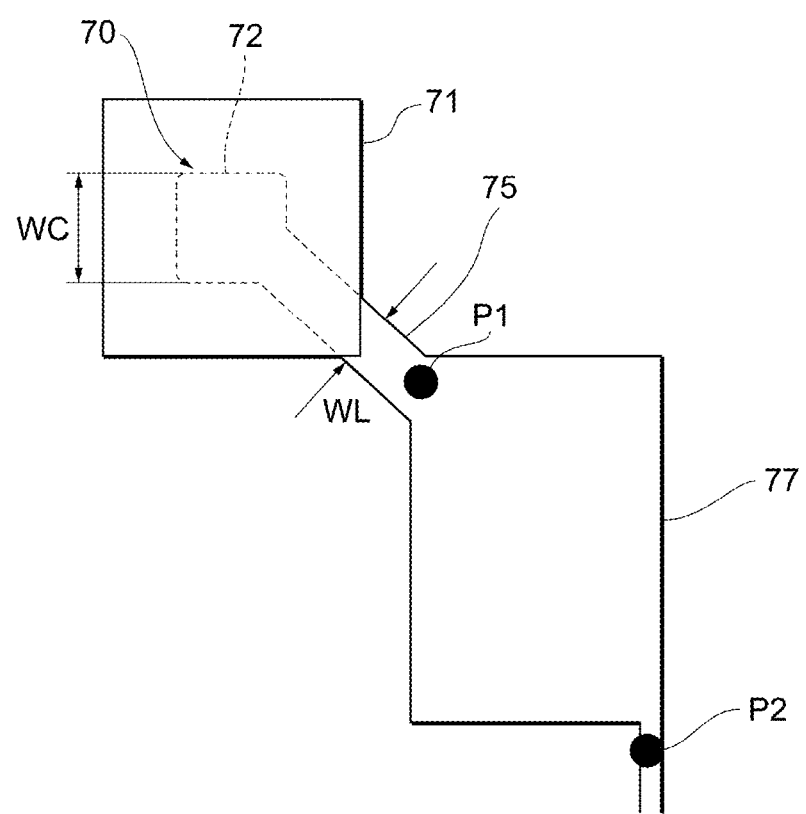
FIG. 6 is an enlarged plan view of a main part illustrating a connection portion and a connection wiring illustrated in FIG. 5.
Figure 7:
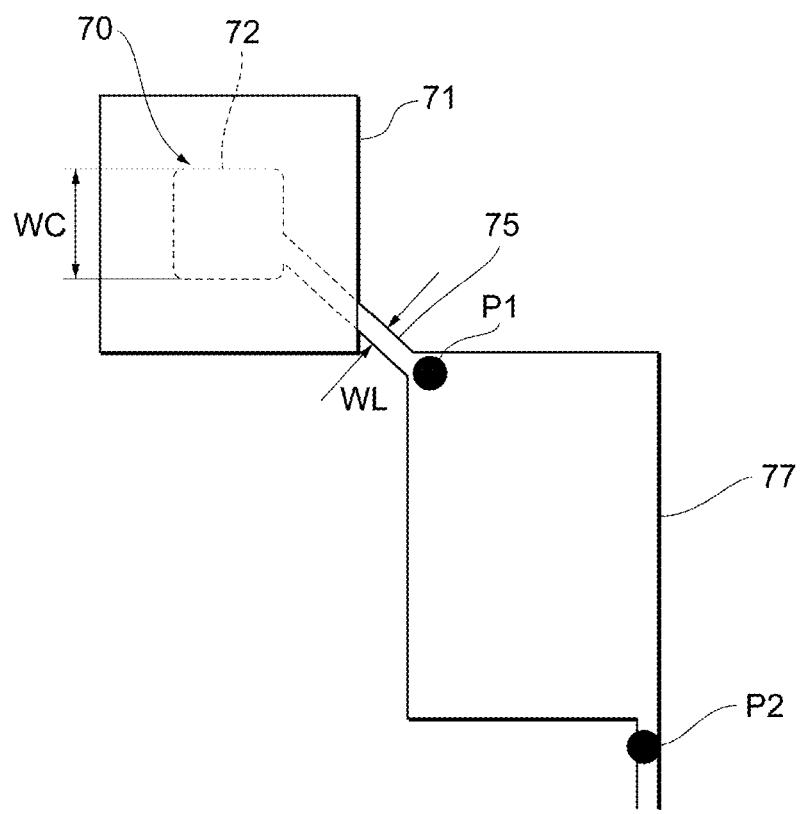
FIG. 7 is an enlarged plan view of a main part illustrating a first modification of the connection wiring illustrated in FIG. 6.

Next, a description will be given of a relationship between the connection portion 70 and the connection wiring 75 with reference to FIG. 5 and FIG. 6. A laminated structure of the resonance device 1 according to an embodiment of the present invention will be described. FIG. 5 is a plan view schematically illustrating the periphery of a holding portion 140a illustrated in FIG. 3. FIG. 6 is an enlarged plan view of a main part illustrating the connection portion 70 and the connection wiring 75 illustrated in FIG. 5. FIG. 7 is an enlarged plan view of a main part illustrating a first modification of the connection wiring 75 illustrated in FIG. 6.

In the connection portion 70 illustrated in FIG. 4, the first metal layer 71 and the second metal layer 72 are bonded with a eutectic bonding. As illustrated in FIG. 5, when the main surface of the MEMS substrate 50 is viewed in a plan view (hereinafter, simply referred to as "a plan view"), the first metal layer 71 is formed in a relatively large (wide) area, and the second metal layer 72 is formed in a relatively small (narrow) area. As illustrated in FIG. 6, the overlapping portions of the first metal layer 71 and the second metal layer 72 are bonded to form a eutectic alloy and correspond to the connection portion 70. In a plan view, the shape of the second metal layer 72, that is, the shape of the connection portion 70 is substantially square and the length of one side thereof is a width WC.

The connection wiring 75 is routed on the holding portion 140 and is electrically connected to the metal layer E1 via the contact electrode 76A. As described above, the connection wiring 75 is electrically connected to the metal layer E1 which serves as the upper electrode of the resonator 10. Although not illustrated, the connection wiring 75 is also electrically connected to the metal layer E2 which serves as the lower electrode of the resonator 10 via the contact electrode 76B illustrated in FIG. 4.

In a plan view, the connection wiring 75 has a line width WL, and the line width WL is smaller than the width WC of the connection portion 70 (line width WL<width WC). Specifically, as illustrated in FIG. 6, a portion of the connection wiring 75 connected to the connection portion 70 has the line width WL, and for example, while the width WC of one side of the connection portion 70 is 30 μm, the line width WL of the connection wiring 75 is set to 15 μm. As described above, since the line width WL of the connection wiring 75 is smaller than the width WC of the connection portion 70, the metal in the first metal layer 71 is unlikely to diffuse along the connection wiring 75 during the eutectic bonding compared with the case where the line width of the connection wiring 75 is larger than or equal to the width WC of the connection portion 70. Therefore, it is possible to reduce the inflow amount of the metal in the first metal layer 71 of the connection portion 70 to the resonator 10. In addition, it is possible to prevent the metal in the first metal layer 71 of the connection portion 70 from affecting the resonator 10 and to prevent the electrical connection at the connection portion 70 from becoming unstable.

Further, the connection wiring 75 includes an electrode pad 77 between the connection portion 70 and the contact electrode 76A connected to the metal layer E1 in a plan view. The electrode pad 77 is for inspecting the electrical connection in the manufacturing process, and has a shape wider than the line width WL of the connection wiring 75. As described above, since the connection wiring 75 includes the electrode pad 77 between the connection portion 70 and the contact electrode 76A in a plan view, the electrode pad 77 serves to block the inflow of the metal in the first metal layer 71, which diffuses along the connection wiring 75, to the resonator 10.

Further, the connection wiring 75 is formed on the piezoelectric thin film F3. Specifically, as illustrated in FIG. 4, the connection wiring 75 is formed on the parasitic capacitance reduction film 240 laminated on the piezoelectric thin film F3. As described above, even though the connection wiring 75 is formed on the piezoelectric thin film F3, since the line width WL of the connection wiring 75 is narrow, it is possible to prevent the metal in the first metal layer 71 from flowing into the vias V1 and V2 through the connection wiring 75. Therefore, it is possible to prevent the deterioration of the insulation resistance caused by the diffusion of the metal in the first metal layer 71 to the piezoelectric thin film F3.

As illustrated in FIG. 7, the line width WL of the connection wiring 75 may be smaller than the line width WL of the connection wiring 75 illustrated in FIG. 6. Specifically, for example, the width WC of one side of the connection portion 70 is 30 μm, and while the line width WL of the connection wiring 75 illustrated in FIG. 6 is 15 μm, the line width WL of the connection wiring 75 illustrated in FIG. 7 is set to 5 μm.

Figure 8:
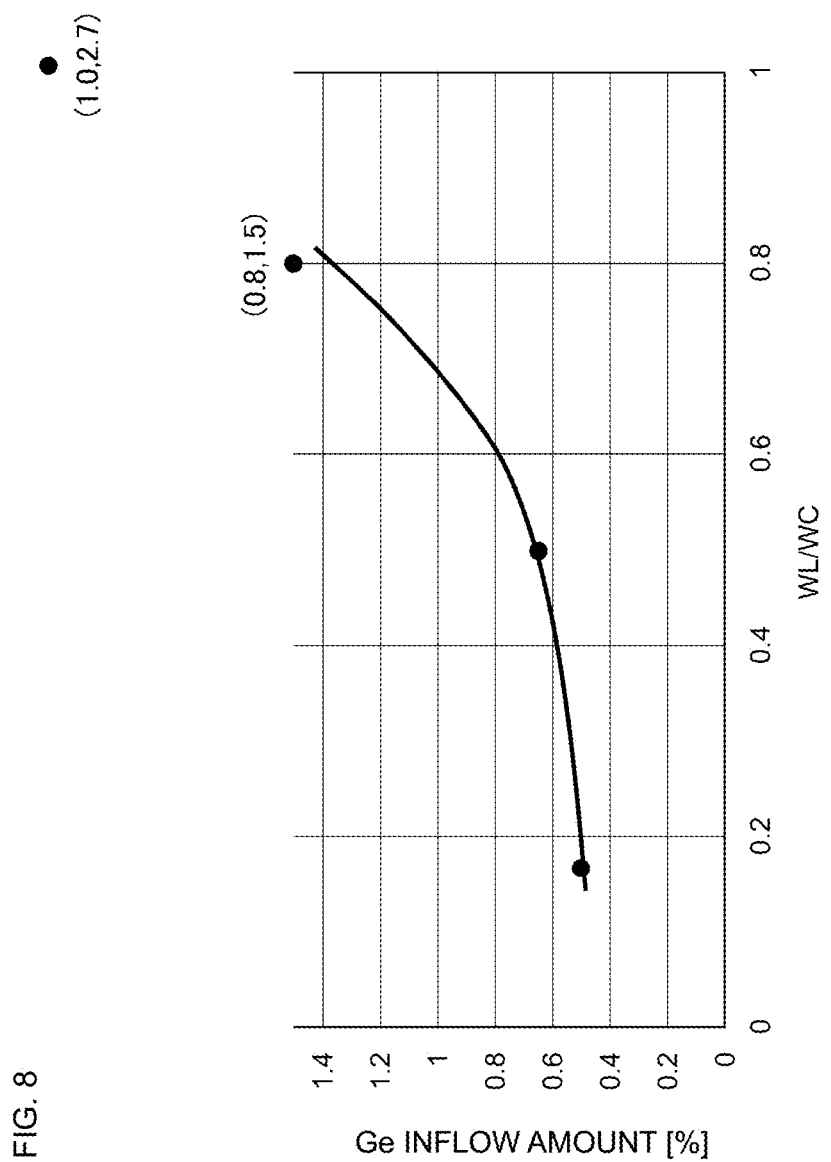
FIG. 8 is a graph describing a relationship between a ratio of a connection wiring width to a connection portion width and an inflow amount of a first metal layer.

Next, with reference to FIG. 8, a relationship between the line width WL of the connection wiring 75 and the inflow amount of the metal in the first metal layer 71 will be described. FIG. 8 is a graph describing a relationship between the ratio of the line width WL of the connection wiring 75 to the width WC of the connection portion 70 and the inflow amount of the metal in the first metal layer 71. In FIG. 8, the metal in the first metal layer 71 is germanium, the horizontal axis represents the ratio of the line width WL to the width WC, and the vertical axis represents the ratio (%) of the amount of germanium flowing into a position P1 of the connection wiring 75 illustrated in FIG. 6 and FIG. 7 to the metal in the connection wiring 75. In addition, the ratio of the inflow amount of germanium to the metal in the connection wiring 75 was measured by a scanning electron microscope and energy dispersive X-ray spectroscopy (SEM/EDX).

As illustrated in FIG. 8, for example, when the ratio of the line width WL to the width WC is 1.0, the inflow amount of germanium in the first metal layer 71 is 2.7%, and when the ratio of the line width WL to the width WC is 0.8, the inflow amount of germanium in the first metal layer 71 is 1.5%. The smaller the ratio of the line width WL to the width WC, that is, the ratio of the line width WL of the connection wiring 75 to the width WC of the connection portion 70 becomes, the less the inflow amount of the germanium, which is in the first metal layer 71, to the position P1 of the connection wiring 75 becomes. In particular, when the line width WL is less than or equal to ½ of the width WC, the reduction in the inflow amount of germanium is remarkable. With this, when the line width WL of the connection wiring 75 is less than or equal to ½ of the width WC of the connection portion 70, it is possible to further reduce the inflow amount of the metal in the first metal layer 71 of the connection portion 70 to the resonator 10.

Note that the connection wiring 75 is not limited to the examples illustrated in FIG. 6 and FIG. 7. It is sufficient that the line width WL of the connection wiring 75 is smaller than the width WC of the connection portion 70 in a plan view, and the length and the shape of the connection wiring 75 may have a form other than those in FIG. 6 and FIG. 7, for example.

Figure 9:
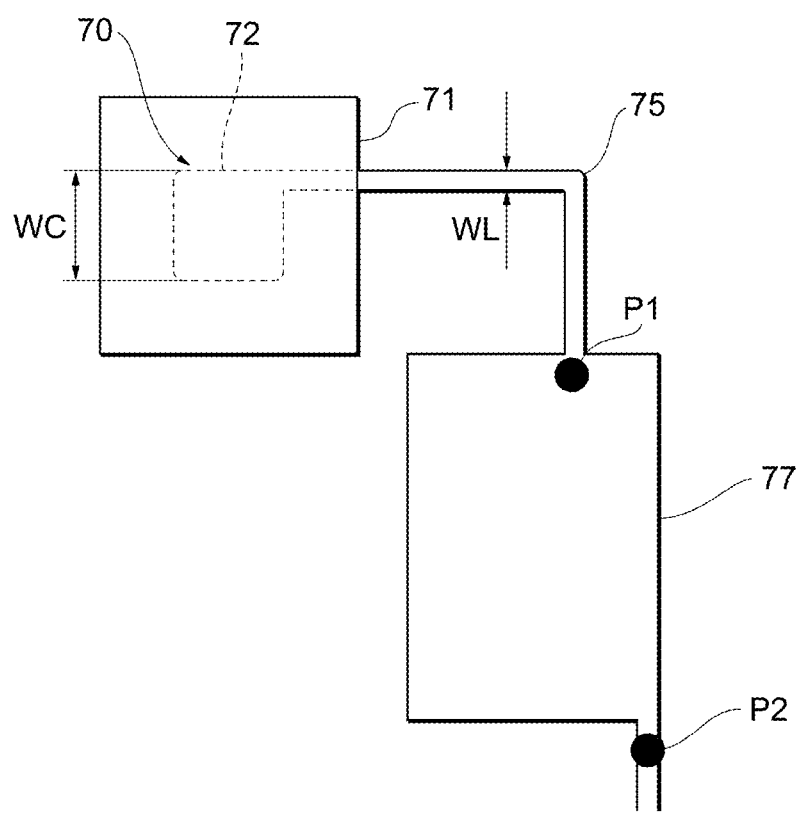
FIG. 9 is an enlarged plan view of a main part illustrating a second modification of the connection wiring illustrated in FIG. 6.
Figure 10:
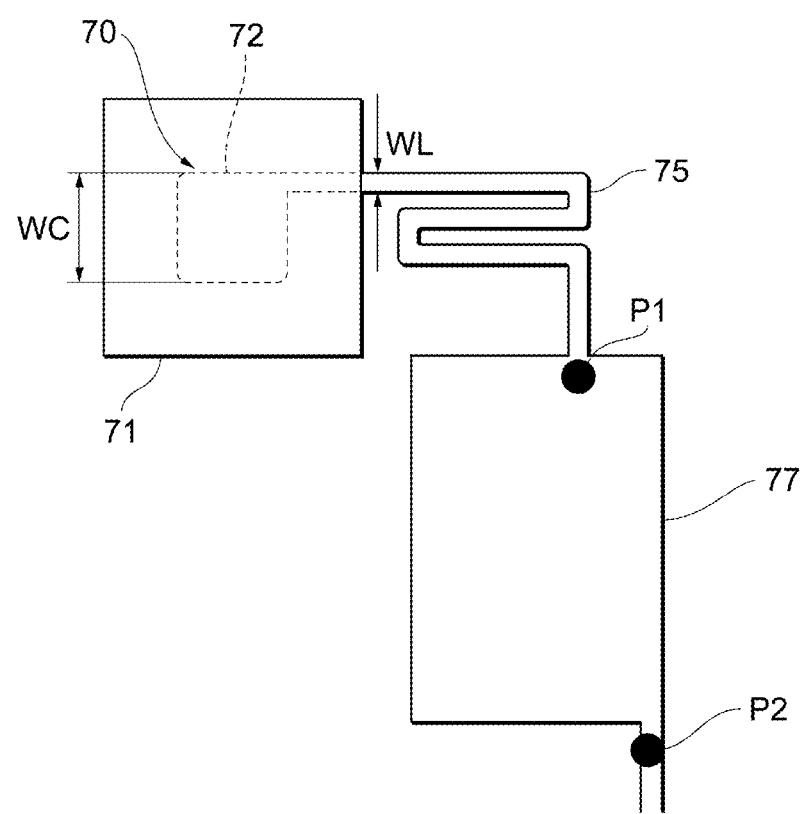
FIG. 10 is an enlarged plan view of a main part illustrating a third modification of the connection wiring illustrated in FIG. 6.
Figure 11:
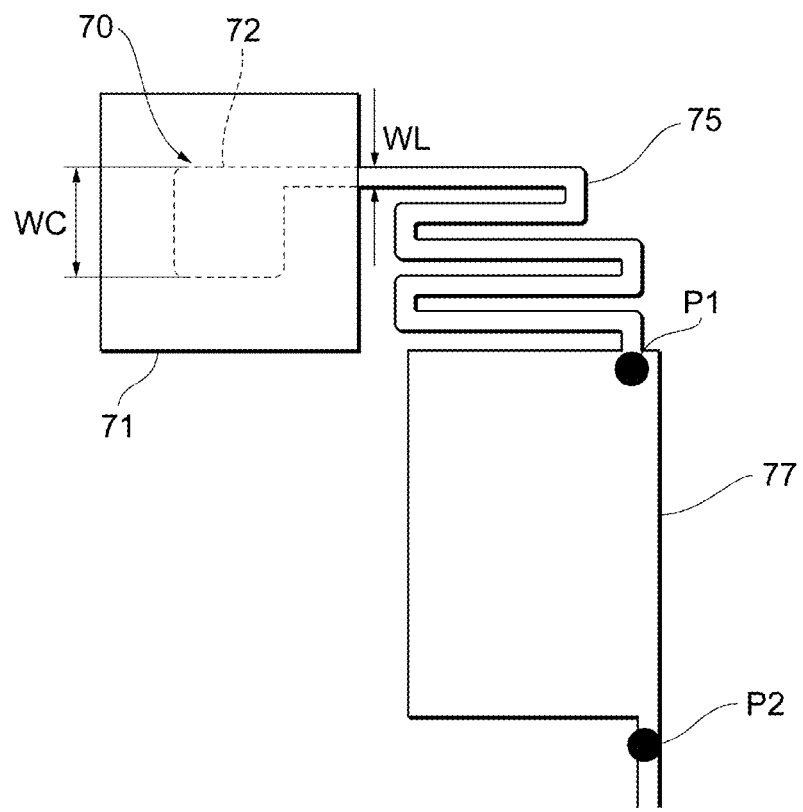
FIG. 11 is an enlarged plan view of a main part illustrating a fourth modification of the connection wiring illustrated in FIG. 6.

Next, a modification of the length of the connection wiring 75 will be described with reference to FIG. 9 to FIG. 11. FIG. 9 is an enlarged plan view of a main part illustrating a second modification of the connection wiring 75 illustrated in FIG. 6. FIG. 10 is an enlarged plan view of a main part illustrating a third modification of the connection wiring 75 illustrated in FIG. 6. FIG. 11 is an enlarged plan view of a main part illustrating a fourth modification of the connection wiring 75 illustrated in FIG. 6.

The line width WL of the connection wiring 75 illustrated in FIG. 9 has a value smaller than the width WC of one side of the connection portion 70, similarly to the example illustrated in FIG. 6. Specifically, for example, while the width WC of one side of the connection portion 70 is 30 μm, the line width WL of the connection wiring 75 illustrated in FIG. 9 is set to 5 μm. The connection wiring 75 illustrated in FIG. 6 and FIG. 7 linearly connects a connection end, which is a connection end of the connection wiring 75 with the connection portion 70, and the electrode pad 77. The connection wiring 75 illustrated in FIG. 9 has a bent shape in part thereof unlike the case above, and is routed to the electrode pad 77 and successively to the contact electrode 76A illustrated in FIG. 5. Accordingly, the length from the connection portion 70 to the contact electrode 76A of the connection wiring 75 in FIG. 9 is five times or more of the length of the connection wiring 75 illustrated in FIG. 6, that is, the linear distance from the connection portion to the contact electrode. Specifically, while the length of the connection wiring 75 illustrated in FIG. 6 is 14 μm, the length of the connection wiring 75 illustrated in FIG. 9 is set to 106 μm.

The line width WL of the connection wiring 75 illustrated in FIG. 10 has a value smaller than the width WC of one side of the connection portion 70, as similar to the example illustrated in FIG. 6. Specifically, for example, while the width WC of one side of the connection portion 70 is 30 μm, the line width WL of the connection wiring 75 illustrated in FIG. 10 is set to 5 μm. Further, the connection wiring 75 illustrated in FIG. 10 has a twisting (zigzag) shape, that is, a meandering shape, and is routed to the electrode pad 77. Accordingly, the length from the connection portion 70 to the contact electrode 76A of the connection wiring 75 illustrated in FIG. 10 is 10 times or more of the length of the connection wiring 75 illustrated in FIG. 6. Specifically, while the length of the connection wiring 75 illustrated in FIG. 6 is 14 μm, the length of the connection wiring 75 illustrated in FIG. 10 is set to 188 μm.

The line width WL of the connection wiring 75 illustrated in FIG. 11 has a value smaller than the width WC of one side of the connection portion 70, similarly to the example illustrated in FIG. 6. Specifically, for example, while the width WC of one side of the connection portion 70 is 30 μm, the line width WL of the connection wiring 75 illustrated in FIG. 10 is set to 5 μm. The connection wiring 75 illustrated in FIG. 11 has a meander shape and is further longer than the connection wiring 75 illustrated in FIG. 10, and is extended to the electrode pad 77. Accordingly, the length of the connection wiring 75 from the connection portion 70 to the contact electrode 76A illustrated in FIG. 11 is 20 times or more of the length of the connection wiring 75 illustrated in FIG. 6. Specifically, while the length of the connection wiring 75 illustrated in FIG. 6 is 14 μm, the length of the connection wiring 75 illustrated in FIG. 11 is set to 337 μm.

Figure 12:
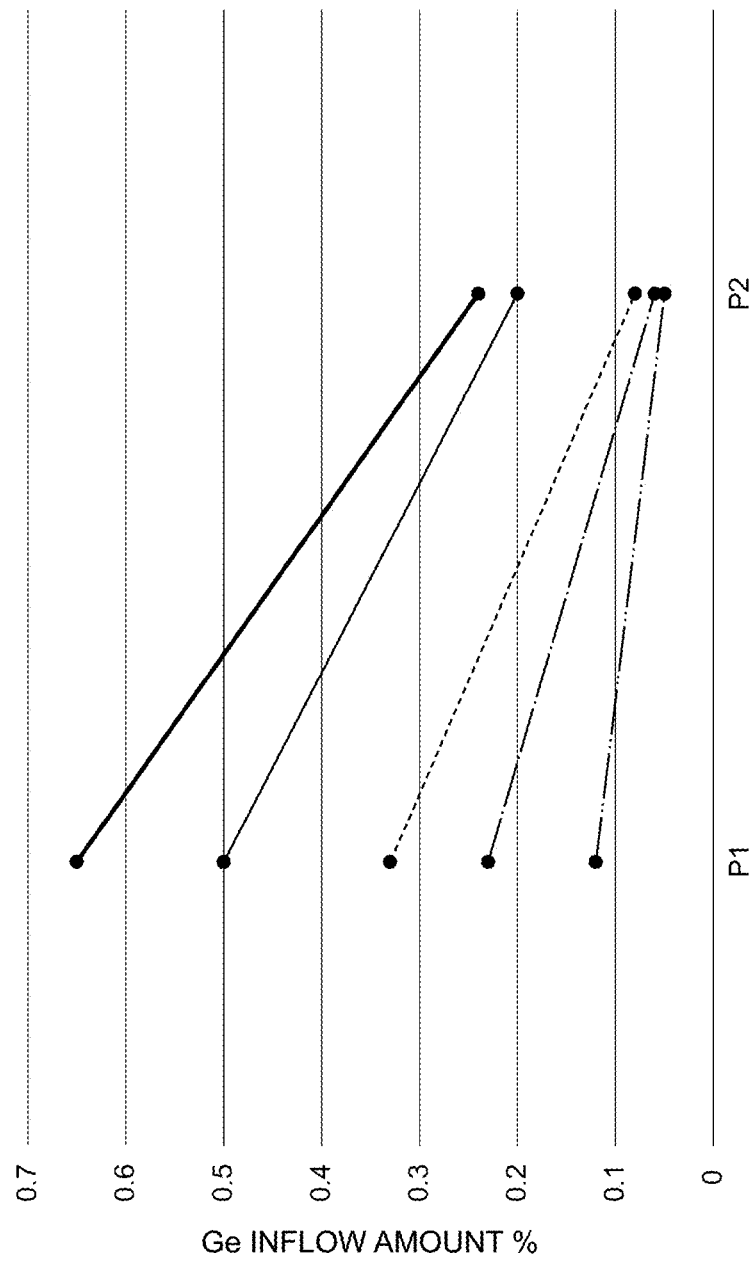
FIG. 12 is a graph describing a relationship between the connection wiring width and length, and the inflow amount of the first metal layer.

Next, a relationship between the length of the connection wiring 75 and the inflow amount of the metal in the first metal layer 71 will be described with reference to FIG. 12. FIG. 12 is a graph describing a relationship between the line width WL and the length of the connection wiring 75 and the inflow amount of the metal in the first metal layer 71. In FIG. 12, the metal in the first metal layer 71 is germanium, the horizontal axis represents the position in the connection wiring 75, and the vertical axis represents the ratio (%) of the amount of germanium flowing into the position P1 and a position P2 of the connection wiring 75 illustrated in FIG. 6, FIG. 7, FIG. 9, FIG. 10, and FIG. 11 to the metal in the connection wiring 75. In addition, the ratio of the inflow amount of germanium to the metal in the connection wiring 75 was measured by a scanning electron microscope and energy dispersive X-ray spectroscopy. FIG. 12 is depicted as follows. The connection wiring 75 illustrated in FIG. 6 with the line width of 15 μm and the length of 14 μm is represented by a bold line. The connection wiring 75 illustrated in FIG. 7 with the line width of 5 μm and the length of 14 μm is represented by a solid line. The connection wiring 75 illustrated in FIG. 9 with the line width of 5 μm and the length of 106 μm is represented by a dashed line. The connection wiring 75 illustrated in FIG. 10 with the line width of 5 μm and the length of 188 μm is represented by a dashed-and-dotted line. The connection wiring 75 illustrated in FIG. 11 with the line width of 5 μm and the length of 337 μm is represented by a dashed-and-double-dotted line.

As illustrated in FIG. 12, the longer the length of the connection wiring 75 becomes, the less the inflow amount of germanium, which is in the first metal layer 71, to the position P1 and the position P2 of the connection wiring 75 becomes. In particular, when the length of the connection wiring 75 from the connection portion 70 to the contact electrode 76A is five times or more of the linear distance from the connection portion 70 to the contact electrode 76A, the reduction in the inflow amount of germanium is remarkable. As described above, since the lengths of the connection wiring 75 from the connection portions 70 to the contact electrodes 76A and 76B are five times or more of the linear distance between the connection portions 70 and the contact electrodes 76A and 76B in a plan view, it is possible to further reduce the inflow amount of the metal in the first metal layer 71 of the connection portion 70 to the resonator 10.

Figure 13:
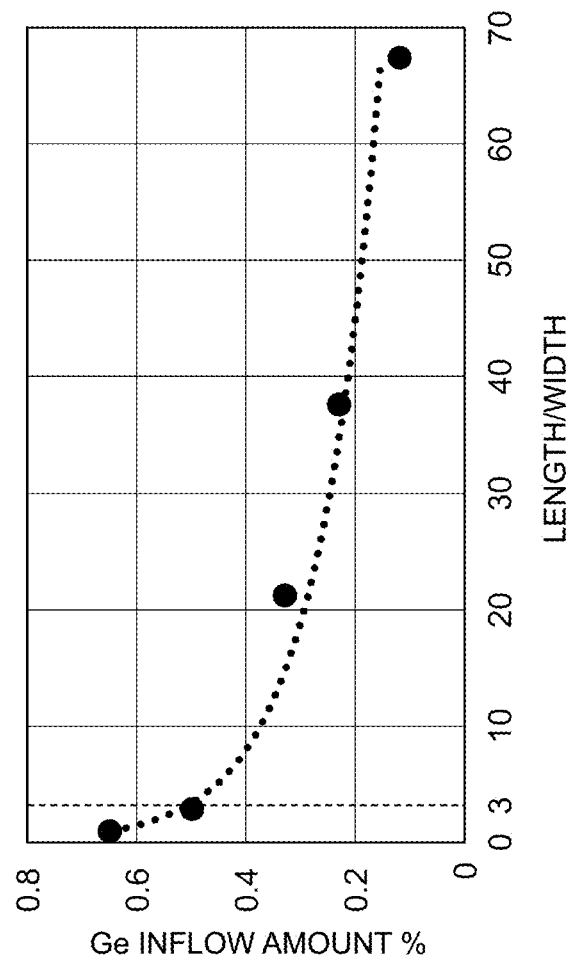
FIG. 13 is a graph describing a relationship between the ratio of the length to width of the connection wiring and the inflow amount of the first metal layer.

Next, the relationship of the length with respect to the width of the connection wiring 75 will be described with reference to FIG. 13. FIG. 13 is a graph describing a relationship between the ratio of the length to the line width WL of the connection wiring 75 and the inflow amount of the metal in the first metal layer 71. In FIG. 13, the metal in the first metal layer 71 is germanium, the horizontal axis represents the ratio of the length to the line width WL of the connection wiring 75, and the vertical axis represents the ratio (%) of the inflow amount of germanium to the position P1 of the connection wiring 75 illustrated in FIG. 6, FIG. 7, FIG. 9, FIG. 10, and FIG. 11 to the metal in the connection wiring 75. In addition, the ratio of the inflow amount of germanium to the metal in the connection wiring 75 was measured by a scanning electron microscope and energy dispersive X-ray spectroscopy.

As illustrated in FIG. 13, the larger the length of the connection wiring 75 becomes with respect to the line width WL of the connection wiring 75, the less the inflow amount of germanium, which is in the first metal layer 71, to the position P1 of the connection wiring 75 becomes. In particular, when the length of the connection wiring 75 from the connection portion 70 to the contact electrode 76A is three times or more of the line width WL of the connection wiring 75, the reduction in the inflow amount of germanium is remarkable. As described above, since the lengths of the connection wirings 75 from the connection portions 70 to the contact electrodes 76A and 76B are three times or more of the line width WL of the connection wiring 75 in a plan view, it is possible to further reduce the inflow amount of the metal in the first metal layer 71 of the connection portion 70 to the resonator 10.

Figure 14:
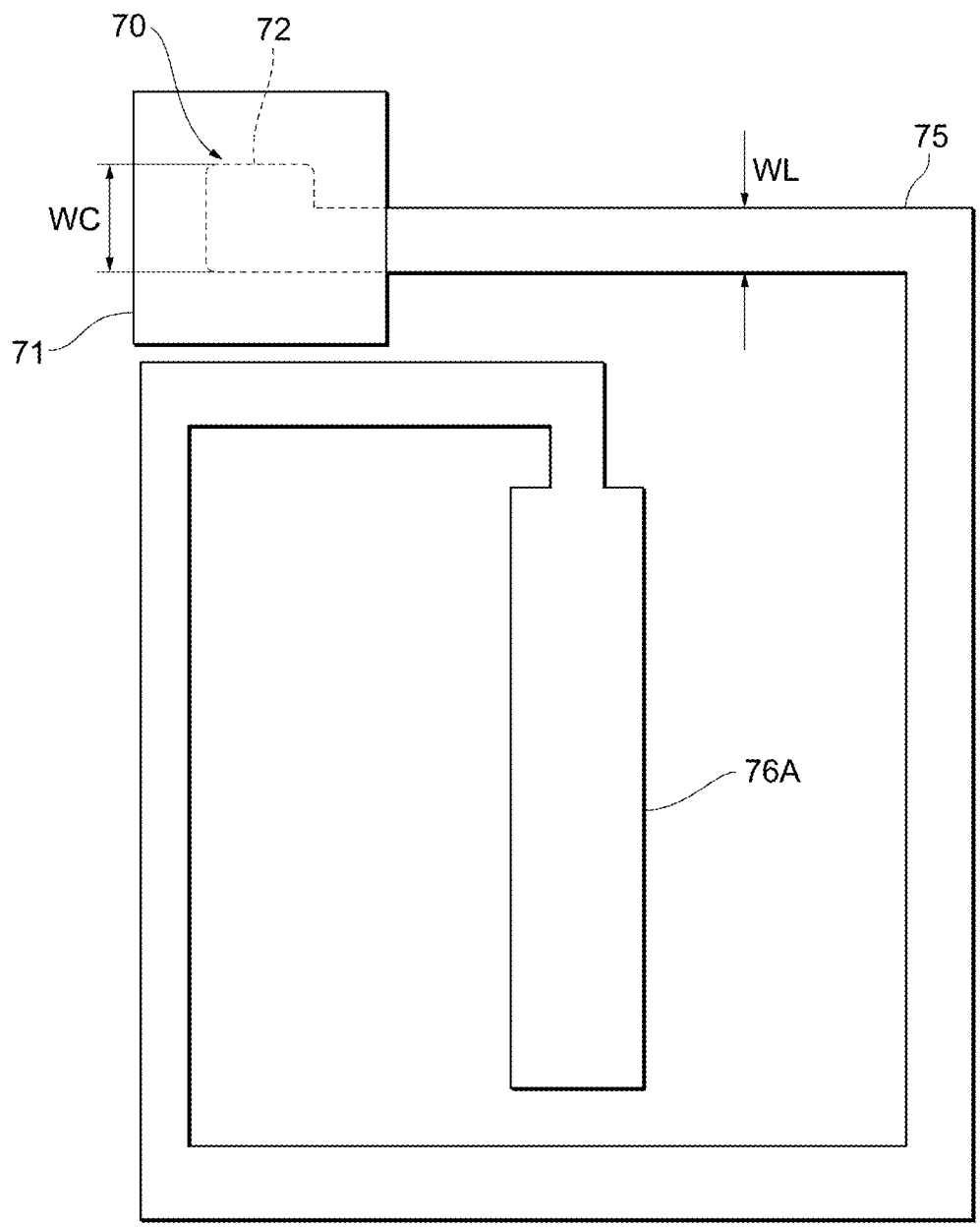
FIG. 14 is an enlarged plan view of a main part illustrating a fifth modification of the connection wiring illustrated in FIG. 6.
Figure 15:
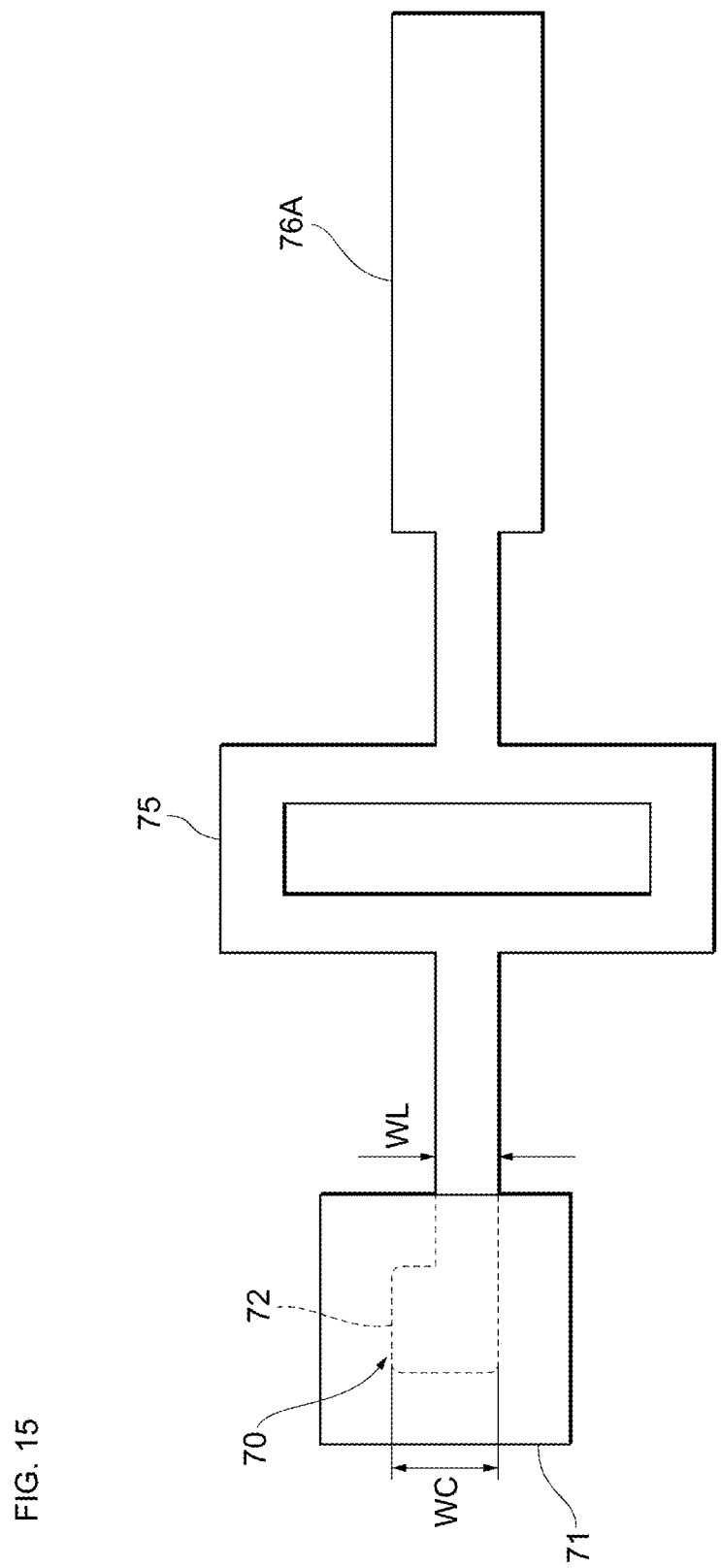
FIG. 15 is an enlarged plan view of a main part illustrating a sixth modification of the connection wiring illustrated in FIG. 6.

Next, a modification of the shape of the connection wiring 75 will be described with reference to FIG. 14 and FIG. 15. FIG. 14 is an enlarged plan view of a main part illustrating a fifth modification of the connection wiring 75 illustrated in FIG. 6. FIG. 15 is an enlarged plan view of a main part illustrating a sixth modification of the connection wiring 75 illustrated in FIG. 6.

As illustrated in FIG. 14, the connection wiring 75 has a spiral shape, and is connected to the contact electrode 76A. Note that the connection wiring 75 illustrated in FIG. 14 may include an electrode pad between the connection portion 70 and the contact electrode 76A, similarly to the example illustrated in FIG. 6. Further, the spiral shape of the connection wiring 75 is not limited to a configuration with a straight line which is partially bent, and the spiral shape may be configured with a curved line, for example.

As illustrated in FIG. 15, the connection wiring 75 has a shape including a branch and a join in the middle of the connection from the connection portion 70 to the contact electrode 76A. Note that the number of branches is not limited to two, and may be three or more. As described above, when the connection wiring 75 has a shape having a branch and a join as illustrated in FIG. 15 or a meander shape illustrated in FIG. 10 and FIG. 11 in a plan view, the length of the connection wiring 75 may be increased. Therefore, it is possible to further reduce the inflow amount of the metal in the first metal layer 71 of the connection portion 70 to the resonator 10.

The exemplary embodiments of the present invention have been described above. In the resonance device 1 according to the embodiment of the present invention, the line width WL of the connection wiring 75 is smaller than the width WC of the connection portion 70 when viewed in a plan view. With this, the metal in the first metal layer 71 is unlikely to diffuse along the connection wiring 75 during eutectic bonding compared with a case in which the line width of the connection wiring 75 is larger than or equal to the width WC of the connection portion 70. Therefore, it is possible to reduce the inflow amount of the metal in the first metal layer 71 of the connection portion 70 to the resonator 10. In addition, it is possible to prevent the metal in the first metal layer 71 of the connection portion 70 from affecting the resonator 10 and to prevent the electrical connection at the connection portion from becoming unstable.

In the resonance device 1 described above, the line width WL of the connection wiring 75 is less than or equal to ½ of the width WC of the connection portion 70. With this, it is possible to further reduce the inflow amount of the metal in the first metal layer 71 of the connection portion 70 to the resonator 10.

In the resonance device 1 described above, the lengths of the connection wirings 75 from the connection portions 70 to the contact electrodes 76A and 76B are five times or more of the linear distances between the connection portions 70 and the contact electrodes 76A and 76B in a plan view. With this, it is possible to further reduce the inflow amount of the metal in the first metal layer 71 of the connection portion 70 to the resonator 10.

In the resonance device 1 described above, the lengths of the connection wirings 75 from the connection portions 70 to the contact electrodes 76A and 76B are three times or more of the line width WL of the connection wiring 75 in a plan view. With this, it is possible to further reduce the inflow amount of the metal in the first metal layer 71 of the connection portion 70 to the resonator 10.

In the resonance device 1 described above, the connection wiring 75 includes the electrode pad 77 between the connection portion 70 and the contact electrode 76A in a plan view. With this, the electrode pad 77 serves to block the inflow of the metal in the first metal layer 71, which diffuses along the connection wiring 75, to the resonator 10.

In the resonance device 1 described above, the connection wiring 75 is formed on the piezoelectric thin film F3. As described above, even though the connection wiring 75 is formed on the piezoelectric thin film F3, since the line width WL of the connection wiring 75 is narrow, it is possible to prevent the metal in the first metal layer 71 from flowing into the vias V1 and V2 through the connection wiring 75. Therefore, it is possible to prevent the deterioration of the insulation resistance caused by the diffusion of the metal in the first metal layer 71 to the piezoelectric thin film F3.

In the resonance device 1 described above, the connection wiring 75 has a shape having a branch and a join illustrated in FIG. 15 or a meandering shape illustrated in FIG. 10 and FIG. 11 in a plan view. This makes it possible to increase the length of the connection wiring 75. Therefore, it is possible to further reduce the inflow amount of the metal in the first metal layer 71 of the connection portion 70 to the resonator 10.

In the resonance device 1 described above, the metal in the first metal layer 71 is germanium (Ge), and the metal in the second metal layer 72 is aluminum (Al). Here, since the eutectic alloy of germanium (Ge) and aluminum (Al) has a large allowance for foreign matter particles compared with the eutectic alloy of other materials, the eutectic reaction is easily achieved and it is possible to obtain a good eutectic bonding at the connection portion 70.

In the resonance device 1 described above, the material of the connection wiring 75 is aluminum (Al) that is the same as the material of the second metal layer 72. With this, it is possible to form the connection wiring 75 and the second metal layer 72 at the same time, and it is possible to simplify the manufacturing process.

The embodiments described above are intended to facilitate understanding of the present invention, and are not intended to limit the present invention. The present invention can be modified or improved without departing from the gist thereof, and the present invention also includes equivalents thereof. In other words, products achieved by design change on the aforementioned embodiments by those skilled in the art, are also included in the scope of the present invention as long as the products are provided with the features of the present invention. For example, the constituent elements included in the embodiments, and their arrangement, materials, conditions, shapes, sizes and the like are not limited to the exemplified ones, and may be modified as appropriate. It is to be noted that the embodiments are merely illustrative, and it is needless to say that it is possible to partially replace or combine the configurations described in the different embodiments, and that these are also included within the scope of the present invention as long as they include the features of the present invention.

REFERENCE SIGNS LIST

1 RESONANCE DEVICE
10 RESONATOR
20 LOWER LID
21 RECESS
22 BOTTOM PLATE
23 SIDE WALL
30 UPPER LID
31 RECESS
33 SIDE WALL
34 GETTER LAYER
50 MEMS SUBSTRATE
60 BONDING PORTION
61 ALUMINUM (Al) LAYER
62 GERMANIUM (Ge) LAYER
63 ALUMINUM (Al) LAYER
70 CONNECTION PORTION
71 FIRST METAL LAYER
72 SECOND METAL LAYER
75 CONNECTION WIRING
76A, 76B CONTACT ELECTRODE
77 ELECTRODE PAD
110 HOLDING ARM
120 VIBRATION PORTION
130 BASE SECTION
135, 135A, 135B, 135C, 135D VIBRATION ARM
140 HOLDING PORTION
141 VOLTAGE APPLYING PORTION
235 PROTECTION FILM
236 FREQUENCY ADJUSTMENT FILM
240 PARASITIC CAPACITANCE REDUCTION FILM
E1, E2 METAL LAYER
F2 SILICON (Si) SUBSTRATE
F3 PIEZOELECTRIC THIN FILM
F21 SILICON OXIDE LAYER
G WEIGHT PORTION
L1 WAFER
L3 SILICON (Si) WAFER
L31 SILICON OXIDE FILM
P VIRTUAL PLANE
P1, P2 POSITION
T4 TERMINAL
V1, V2 VIA
V3 THROUGH-ELECTRODE
WC WIDTH
WL LINE WIDTH

The invention claimed is:

1. A MEMS device, comprising:
a substrate including an element and a connection wiring electrically connected to the element; and
a connection portion electrically connected to the connection wiring and formed of a eutectic alloy of a first metal and a second metal,
wherein a width of the connection wiring is smaller than a width of the connection portion when a main surface of the substrate is viewed in a plan view of the substrate,
wherein the substrate further includes a contact electrode that electrically connects the connection wiring and the element,
wherein a length of the connection wiring from the connection portion to the contact electrode is five times or more of a linear distance between the connection portion and the contact electrode in the plan view, and
wherein the connection wiring further includes an electrode pad between the connection portion and the element in the plan view.

2. The MEMS device according to claim 1, wherein the electrode pad is wider than a line width of the connection wiring.

3. The MEMS device according to claim 1, wherein the connection wiring has a bent shape or a meander shape between the connection portion and the electrode pad in the plan view.

4. The MEMS device according to claim 1,
wherein MEMS device further includes a piezoelectric film on the main surface of the substrate, and
the connection wiring is on the piezoelectric film.

5. The MEMS device according to claim 1, wherein the first metal is germanium, and the second metal is aluminum.

6. The MEMS device according to claim 5, wherein a material of the connection wiring is aluminum.

7. A MEMS device, comprising:
a substrate including an element and a connection wiring electrically connected to the element; and
a connection portion electrically connected to the connection wiring and formed of a eutectic alloy of a first metal and a second metal, wherein a width of the connection wiring is smaller than a width of the connection portion when a main surface of the substrate is viewed in a plan view of the substrate, wherein the substrate further includes a contact electrode that electrically connects the connection wiring and the element, wherein a length of the connection wiring from the connection portion to the contact electrode is three times or more of the width of the connection wiring in the plan view, and wherein the connection wiring further includes an electrode pad between the connection portion and the element in the plan view.

8. The MEMS device according to claim 7, wherein the electrode pad is wider than a line width of the connection wiring.

9. The MEMS device according to claim 7, wherein the connection wiring has a bent shape or a meander shape between the connection portion and the electrode pad in the plan view.

10. The MEMS device according to claim 7,
wherein MEMS device further includes a piezoelectric film on the main surface of the substrate, and
the connection wiring is on the piezoelectric film.

11. The MEMS device according to claim 7, wherein the first metal is germanium, and the second metal is aluminum.

12. The MEMS device according to claim 11, wherein a material of the connection wiring is aluminum.

13. A MEMS device, comprising:
a substrate including an element and a connection wiring electrically connected to the element; and
a connection portion electrically connected to the connection wiring and formed of a eutectic alloy of a first metal and a second metal,
wherein a width of the connection wiring is smaller than a width of the connection portion when a main surface of the substrate is viewed in a plan view of the substrate, and
wherein the connection wiring further includes an electrode pad between the connection portion and the element in the plan view.

14. The MEMS device according to claim 13, wherein the width of the connection wiring is less than or equal to ½ of the width of the connection portion.

15. The MEMS device according to claim 13, wherein the electrode pad is wider than a line width of the connection wiring.

16. The MEMS device according to claim 13, wherein the connection wiring has a bent shape or a meander shape between the connection portion and the electrode pad in the plan view.

17. The MEMS device according to claim 11,
wherein MEMS device further includes a piezoelectric film on the main surface of the substrate, and
the connection wiring is on the piezoelectric film.

18. The MEMS device according to claim 11, wherein the first metal is germanium, and the second metal is aluminum.

19. The MEMS device according to claim 18, wherein a material of the connection wiring is aluminum.

* * * * *